United States Patent [19]

Biard

[11] 3,838,439

[45] Sept. 24, 1974

[54] PHOTOTRANSISTOR HAVING A BURIED BASE

[75] Inventor: James R. Biard, Richardson, Tex.

[73] Assignee: Texas Instruments Incorporated, Dallas, Tex.

[22] Filed: Nov. 15, 1972

[21] Appl. No.: 306,763

Related U.S. Application Data

[63] Continuation of Ser. No. 20,708, March 18, 1970.

[52] U.S. Cl. .................... 357/30, 357/89, 250/211 J
[51] Int. Cl. .................... H01l 15/00
[58] Field of Search ................ 317/235 N, 235 AM; 250/211 J

[56] References Cited

UNITED STATES PATENTS

| | | | |
|---|---|---|---|
| 3,007,090 | 10/1961 | Rutz | 317/235 |
| 3,413,480 | 11/1968 | Biard | 250/211 |
| 3,532,945 | 10/1970 | Weckler | 317/235 |

*Primary Examiner*—Martin H. Edlow
*Attorney, Agent, or Firm*—Harold Levine; James T. Comfort; Richard Donaldson

[57] ABSTRACT

A photosensitive semiconductor device is disclosed which includes a substrate of N-type semiconductor material, with an area or P-type semiconductor material being embedded a preselected distance beneath the surface of the substrate. An electrical contact is connected to the substrate adjacent the central region of the area of P-type material. The central region of the P-type material provides phototransistor operational characteristics, while the junction formed between the N-type and P-type semiconductor materials provides photodiode operational characteristics.

9 Claims, 12 Drawing Figures

INVENTOR
JAMES R. BIARD

INVENTOR
JAMES R. BIARD

PHOTOTRANSISTOR HAVING A BURIED BASE

This is a continuation of application Ser. No. 020,708, filed Mar. 18, 1970.

This invention relates to semiconductor devices, and more particularly to semiconductor photosensitive devices.

Semiconductor photodiodes have been heretofore constructed in order to produce current substantially in proportion to the quantum to light striking the photosensitive region of the diode junction. While such photodiodes have proved useful for such applications as infrared detection, the current generated by such devices has generally required substantial amplification. In an effort to overcome the requirement of a separate amplification stage, phototransistors have been developed which produce relatively high current levels for a given incident photon level. One such type of phototransistor utilizes one junction formed between a P-type diffused region and an N-type substrate and a second junction formed between a metal contact film and the P-type region. However, such previously developed phototransistors have been subject to relatively high surface leakage due to the surface exposed P-type region. Moreover, many previously developed phototransistors have not provided a sufficiently high level of $h_{FE}$ at low current levels.

In accordance with the present invention, a photosensitive device is fabricated with a buried P-type region in order to substantially reduce leakage current and to assure a relatively high level of $h_{FE}$ at low current operation level.

In accordance with one aspect of the present invention, a photosensitive device includes a semiconductor body having a discrete area of opposite semiconductor type formed beneath the surface of said body. An electrical contact is disposed on the surface of the semiconductor body.

In accordance with a more specific aspect of the invention, a photosensitive semiconductor device includes a substrate of a first type semiconductor material. A discrete region of a second type semiconductor material is embedded beneath the substrate, with an electrical contact connected to the substrate adjacent the central portion of the region. In the preferred embodiment of the invention, the substrate is constructed from N-type material and the discrete region is constructed from P-type material.

In accordance with yet another aspect of the invention, a process for fabricating a photosensitive semiconductor device includes the formation of a discrete area of a first type semiconductor material in a body of a second type semiconductor material. A layer of the second type semiconductor material is formed over the discrete area. A conductive contact is then applied over the layer of the second type semiconductor material near the central region of the discrete area.

For a more complete understanding of the present invention and for further objects and advantages thereof, reference is now made to the following description taken in conjunction with the accompanying drawings, in which.

Figure 7:
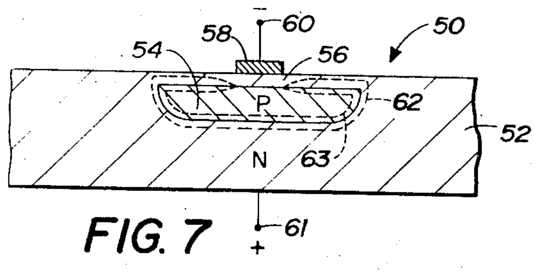
Figure 8:
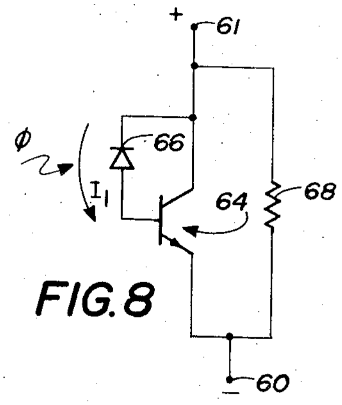
Figure 9:
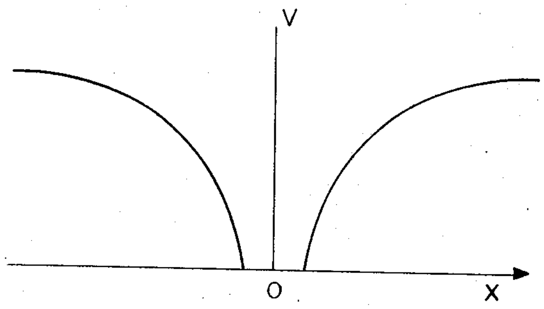
Figure 10A:
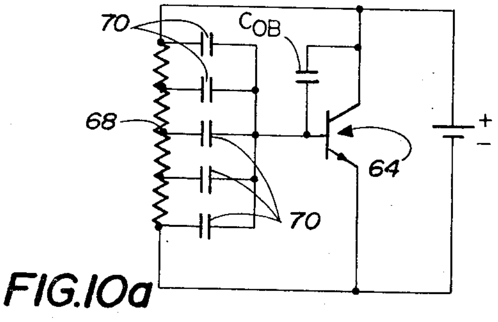
Figure 10B:
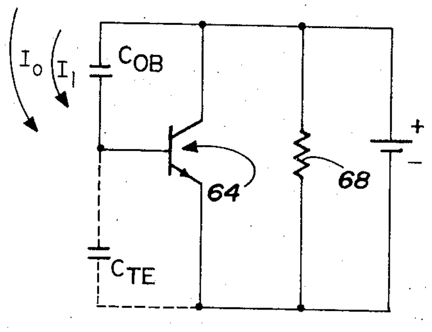
Figure 10C:
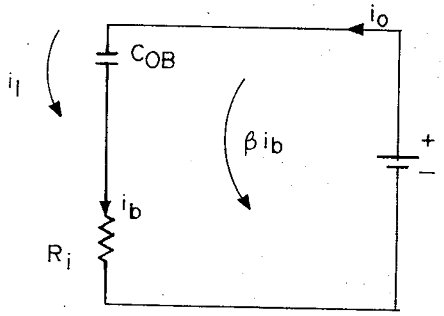
Figure 11:
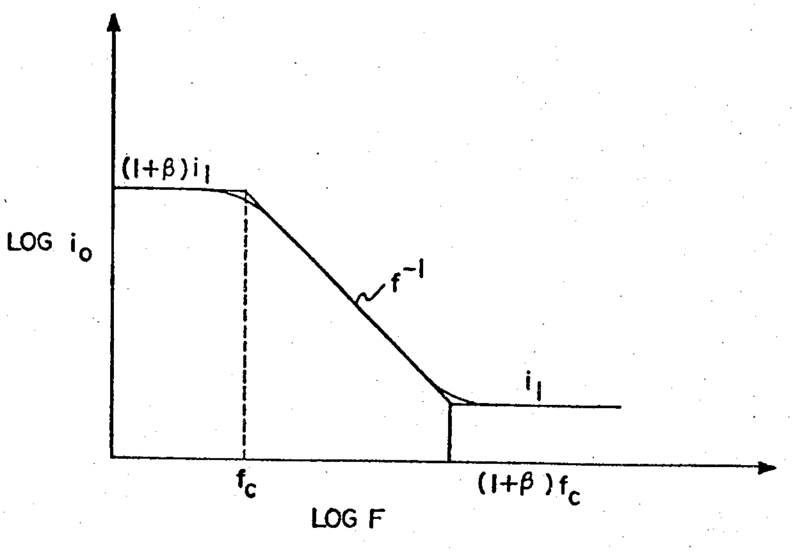
Figure 12:
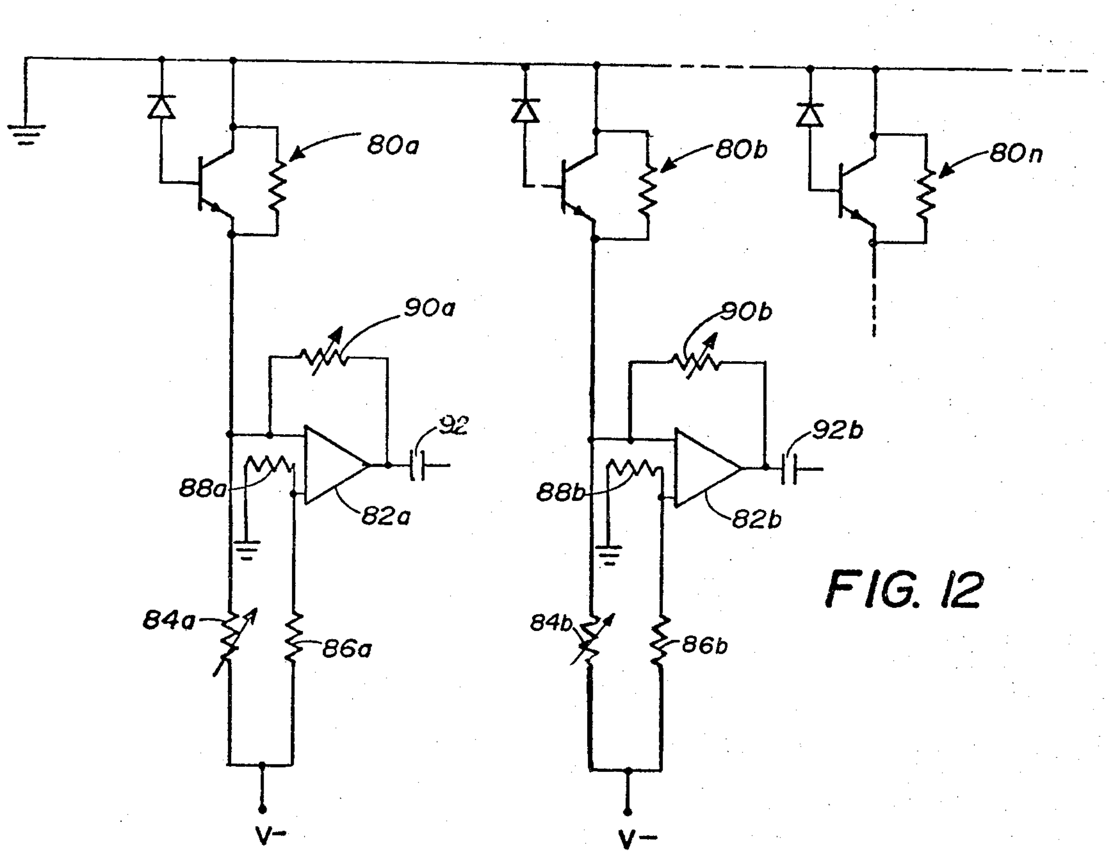

FIG. 7 somewhat diagrammatically illustrates the photosensitive device according to the invention;

FIG. 8 is a schematic approximation of the device shown in FIG. 7;

FIG. 9 is a graph illustrating the voltage gradient occurring within the device shown in FIG. 7 during operation;

FIGS. 10*a–c* are equivalent circuits for use in explanation of the frequency response of the device shown in FIG. 7;

FIG. 11 is a graph illustrating the frequency response of the present device; and FIG. 12 is a schematic diagram illustrating the use of the present device in an array.

Figures 1, 2, 3, 4, 5, 6:
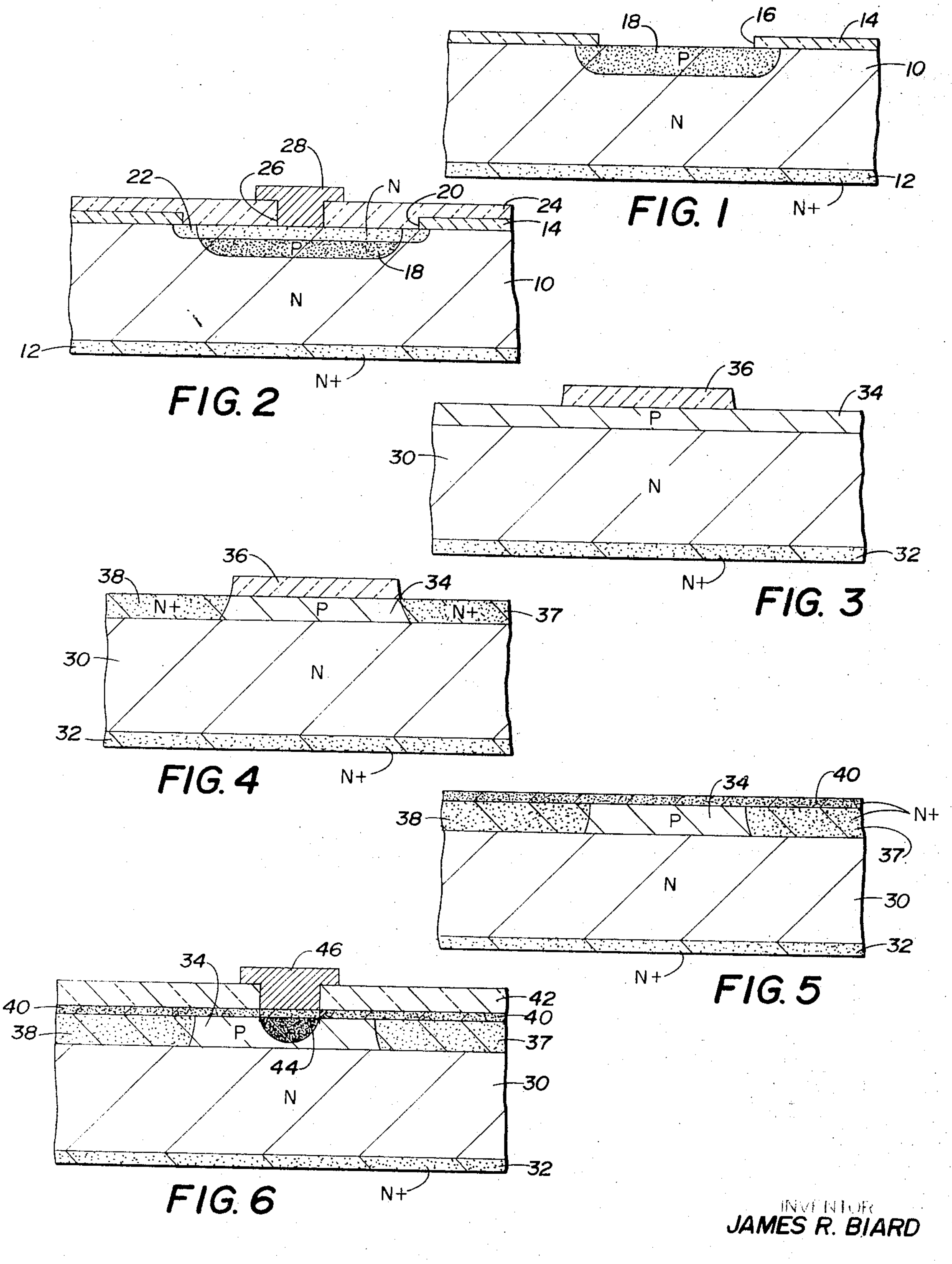
FIG. 1 illustrates the initial fabrication steps for the device according to one embodiment.
FIG. 2 illustrates the final steps of fabrication of the device shown in FIG. 1.
FIGS. 3–5 illustrate fabrication steps in the preparation of the device according to a second embodiment of the invention.
FIG. 6 illustrates the final fabrication of the device shown in FIGS. 3–5.

FIGS. 1 and 2 illustrate various steps in the fabrication of one embodiment of the present device. Referring to FIG. 1, a photosensitive device is fabricated by beginning with an N-type substrate 10 which may comprise silicon, germanium, indium arsenide (InAs), or the like. Other N-type semiconductor compounds in the III–V Groups may also be utilized. An N + -type semiconductor layer 12 may be formed on the underside of the substrate 10, although layer 12 will not be required for many applications. A diffusion mask 14 having a window or opening 16 is formed over the upper surface of the substrate 10 utilizing conventional techniques. In the preferred embodiment, the mask 14 comprises a silicon dioxide layer deposited by a conventional process. The silicon dioxide is then coated with a suitable photoresist compound, and a window, typically of a few mils in area, is developed in the photoresist. The opening 16 is then etched in the silicon dioxide utilizing a suitable etching solution, such as hydroflouric acid or the like.

A P-type impurity is then diffused through the opening 16 into the substrate 10 to form a discrete P-type region 18. The P-type impurity may comprise any suitable material such as cadmium, zinc or magnesium. The diffusion is carried out according to conventional techniques, as by utilization of a conventional two zone diffusion furnace.

Referring to FIG. 2, a silicon dioxide mask 14 is again coated with a suitable photoresist and a larger window 20 is developed in the photoresist. The window 20 is then etched into the silicon dioxide by a suitable etching solution. The etching of the larger window 20 allows a second diffusion of an N-type impurity to form a layer 22 of a N-type material over the P-area 18. The N-type dopant utilized to form the layer 22 may comprise any suitable N-type dopant compatible with the substrate 10, such as phosphorous for silicon, or Arsenic or Antimony for a germanium substrate. Normally, the depths of the diffused regions 18 and 22 are in the range of a few microns.

An oxide layer 24 is then grown by conventional techniques over the mask 14 and the diffused layer 22. A window 26 is formed in layer 24 by coating with photoresist, developing and etching. The oxide layer 24 is then covered with a thin film of metal by a conventional technique such as vacuum depositing. The metal film is then patterned to produce a metal contact 28. The metal contact 28 may comprise aluminum or another suitable metal which will not alloy or diffuse into the semiconductor material. The contact 28 will typically have a thickness of several thousand Angstrom units.

The insulating layers 14 and 24, and to a large extent the metal contact 28, the transparent to light energy. Incident light energy upon the device of FIG. 2 is then absorbed in the diffused regions 18 and 22 and produces excess carriers. It will be seen from an inspection of FIG. 2 that a phototransistor is provided by the present invention which is somewhat similar to prior art devices, with the exception of the thin layer of N-type material 22 disposed between the P-type area 18 and the metal contact 28. In the preferred embodiment of the invention, the metal contact 28 is located near the central region of the P-type area 18. As will be subsequently described in greater detail, the N-type layer 22 is provided with a selected thickness and dopant concentration to provide a predetermined sheet resistance to the device.

FIGS. 3–6 illustrate sequential steps in the fabrication of the present device according to another process. Referring to FIG. 3, fabrication of the device is initiated with a body 30 of N-type material, with a layer 32 of N + -type material also being added if desired. Instead of the diffusion step previously described, a P-type layer 34 is epitaxially grown upon the upper substrate of the body 30 by conventional techniques. A layer of suitable insulating material such as silicon dioxide is formed over the entire surface of the epitaxial layer 34. The layer is then coated with a suitable photoresist and developed according to a predetermined mask. The silicon dioxide is then etched by a suitable etchant to leave the dioxide layer 36.

N + -type dopant is then diffused into the epitaxial layer 34 by conventional diffusion techniques to form N + -type diffusion areas 37 and 38 completely isolating the P-type layer 34, as shown in FIG. 4. The N-type dopant utilized may comprise any suitable conventional material such as phosphorous, Arsenic or Antimony. After the diffusion step, the dioxide layer 36 is etched away, and as shown in FIG. 5, a thin layer 40 of N + -type is diffused into the body. The thickness and doping concentration of the layer 40 will be proportional to the desired sheet resistance of the device.

As shown in FIG. 6, an upper oxide layer 42 is then deposited over the diffused layer 40, and a window is etched through the layer 42 by conventional photoresist and etch techniques. A region 44 of N-type material is then diffused into layer 40 and also into the P-type region 34. A metal film is then deposited over the oxide layer 42, as by evaporation, and the metal contact 46 is formed. The metal contact 46 may comprise any suitable contact metals such as aluminum, titantiumgold, molybdenum-gold, or the like.

The finished device according to the invention in FIG. 6 comprises a buried P-type region 34, along with a N-type region 44. The N-type region 44 is not required in the basic aspect of the invention, but it is believed that this region provides improved gain and bandwidth characteristics to the device.

It should also be understood that instead of utilizing the epitaxial layer 34 shown in FIG. 3, that a layer of P-type material could be diffused into the substrate 30. In some instances, such a diffusion of the P-type layer will provide a field gradient in the base of the transistor during the operation to improve the frequency response of the device.

FIG. 7 illustrates somewhat diagrammatically the present photosensitive device identified generally by the the numeral 50. Device 50 may be constructed by either of the methods previously described, and comprises an N-type substrate 52 and a discrete area of P-type material 54 embedded therein. A thin layer 56 of N-type material is disposed between the buried P-type area 54 and a metal contact 58. Bias voltage is applied to the device across terminals 60 and 61. When the device 50 is suitably biased, a depletion layer occurs which is defined by dotted lines 62 and 63.

FIG. 8 is a schematic of the equivalent circuit of the device 50 during operation. The small central area of the P-type region 54 beneath the contact 58 provides transistor action which is represented by the transistor 64. The remainder of the reverse biased P-N junction of the device 50 forms a collector-base junction to provide diode operating characteristics represented by diode 66. The thin layer 56 of N-type material formed between the P-type area 54 and the contact 58 provides a sheet resistance 68 to the device, the magnitude of the resistance being dependent upon the thickness and the dopant concentration of the layer.

FIG. 9 is a graph representing the voltage gradient occurring in the device 50 on either side of the center of the P-type area 54. The voltage drop in the N-type layer 56 is greatest in the immediate region of the metal contact 58. This is primarily due to radial current flow in the N-type layer 56. Due to this voltage drop phenomenon, the active emitter which provides the transistor action of the device is limited to the region directly adjacent the metal contact 58, with the remainder of the P-N junction being reverse biased to varying degrees to form a part of the collector-base junction.

In operation, device 50 is biased across terminals 60 and 61 with a suitable voltage, generally 1 volt or less, with the collector being more positive than the emitter. The buried P-type base area 54 establishes a voltage bias level slightly positive with respect to the emitter contact 58, so that the small active emitter area beneath contact 58 is formward biased. The remainder of the P-N junction formed between the P-type region 54 and the N-type substrate 52 is relatively reverse biased and forms the collector-base portion of the device.

When the device 50 is illuminated, the photons are absorbed in the N-type layer 56, the buried P-type base area 54, and the N-type body 52. Minority carriers are generated due to this photon absorption, the carriers moving to the depletion region between dotted lines 62 and 63 and resulting in a collector-base photocurrent. Various portions of this photocurrent are distributed along the resistance created by the N-type layer 56, but in all cases, the photocurrent flows to the base region to result in a forward bias at the emitter base junction of the device.

Since the active emitter area of the device is immediately adjacent to the emitter contact 58, there is no significant emitter-base photocurrent. The action of the device may thus be effectively considered in two distinct aspects, that of the photodiode action of the reverse biased collector-base junction and that of the transistor action of the small central area underneath the emitter contact 58.

An extremely important aspect of the present device is that the base layer of the phototransistor is completely buried and therefore has no exterior surface. This substantially reduces surface or space charge leakage of the device, and the reverse biased collector-base junction is dominated by bulk-type leakage. The overall collector base leakage is thus generally substantially lower than that achieved in a conventional exposed junction P-N phototransistor device. Additionally, the forward biased emitter-base junction has a minimum of "$nkT$" current. As a result, the $h_{FE}$ of the device generally has little variation with current level, thereby assuring a high level of $h_{FE}$ at very low current level operation. This combination of high $h_{FE}$ at low current and low leakage thus provides device 50 with optimum characteristics needed to amplify small photocurrents in many applications.

Preliminary calculations performed on the present device indicate low noise operation. Such calculations indicate that the area of the contact 58 should be fabricated as small as possible, and should be located near the center of the P-type base area 54 in order to give the highest possible value of resistance in the N-type layer 56.

FIG. 10*a* represents an equivalent circuit obtained when the present device is operated under AC short circuit conditions. A portion of the collector-base capacitance is distributed along the length of the resistor 68, as indicated by the parallel connected capacitances 70 tied between the resistor 68 and the base of transistor 64. Initial calculations indicate that this distributed capacitance is negligible in practical applications, so that no generality is lost in lumping the collector-base capacitance, termed $C_{OB}$, between the collector and the base of the transistor 64, in the manner shown in FIG. 10*b*. Since the sheet resistance 68 is connected in parallel with the low impedance voltage source of the circuit, resistance 68 does not contribute to the frequency response of the device and will subsequently be ignored in calculations. The emitter transistor capacitance, termed $C_{TE}$, is illustrated in FIG. 10*b* in dotted lines between the base and the emitter of transistor 64. However, if the collector-base capacitance $C_{OB}$ is taken as the total capacitance between the base and the surrounding N-type material of the device, the emitter transistor capacitance $C_{TE}$ may be ignored as an independent effect in frequency response calculations.

Without considering capacitance $C_{TE}$, the transistor portion of the circuit shown in FIG. 10*b* has a frequency response limited only by the base transit time of the device. It may be shown that the cutoff frequency $f_c$ of the device is represented by:

$$f_c \approx D/\pi W^2 \qquad (1)$$

wherein, $D$ = diffusion constant, and $W$ = the base width in centimeters.

Typical parameters for the device are $D = 800$ cm²/sec and $W = 4\mu m$, thereby providing a typical cutoff frequency $f_c$ of approximately $1.6 \times 10^9$Hz.

From the foregoing, it may be seen that the speed of the transistor action of the device is not a significant factor in limiting the device performance. For example, for $\beta = 1{,}600$, the transistor response will be flat to in the region of 1MHz. Since minority carriers generated by incident photons upon the device have to diffuse over distances of about $W/2$, the speed of the photodiode response of the device is of the same order as $f_c$. Therefore, the photodiode response is also not a limiting factor in the frequency response of the detector.

The major limitation on the frequency response of the device results from the small signal time constant due to the interaction of the capacitance $C_{OB}$ and the input resistance of the phototransistor. The input resistance $r_i$ is given by:

$$r_i = (1 + \beta) r_e \qquad (2)$$

wherein, $r_e = kT/qI_e$, $k$ = Boltzman's constant, $T$ = absolute temperature, $q$ = electron charge, and $I_e$ = emitter current.

Substituting, $$r_i = kT/q\ (1 + \beta/I_e) \qquad (3)$$

But, it may be shown that:

$$I_e/1 + \beta = I_b \qquad (4)$$

with the result that:

$$r_i - kT/qI_b \qquad (5)$$

It may thus be noticed that the input resistance $r_i$ is independent of $\beta$. The cutoff frequency for a small signal is given as:

$$f_c = 1/2\pi r_i C_{OB} = qI_b/2\pi kTC_{OB} \qquad (6)$$

It may be seen from FIG. 10*b* that:

$$I_b = I_1 + I_0 \qquad (7)$$

wherein, $I_1$ = collector base photocurrent, and $I_0$ = dark leakage current, and therefore, $$f_c = q(I_1 + I_0)/2\pi kTC_{OB} \qquad (8)$$

It may be seen from equation 8 that the cuttoff frequency is independent of $\beta$, but is dependent upon $I_1$. Therefore, high ambient light levels will provide faster response for the device. Additionally, the doping level in the collector and base of the device should be as low as possible to minimize the value of the capacitance $C_{OB}$. For typical values at 200°K of $kT/q$ = 16mv, and for typical values of $C_{OB} = 40 \times 10^{-12} fd$ and $I_1 + I_0 = 27 \times 10^{-9} A$, a frequency cutoff of approximately 7$k$Hz results for the device.

Referring to FIG. 10*c* which is an extremely simplified equivalent circuit of the present device, it may be shown that the following transfer function results:

$$i_o/i_1 = (1 + \beta)\ [1 + j\, f/(1 + \beta)\, f_c/1 + j\, f/f_c] \quad (9)$$

Utilizing this transfer function, the frequency response shown in FIG. 11 results. A cutoff frequency of 7kHz provides a response time $\tau$ of about $2.4 \times 10^{-5}$ sec. The 10–90 percent rise time is thus about 53 microseconds. This rise time may be reduced even further by utilizing lightly doped semiconductor materials for fabrication of the device. In some utilizations of the device, it may be desirable to supply artificial illumination in order to keep $I_1$ high enough to maintain a desired high speed of response.

The device is particularly adapted for fabrication and utilization in arrays. FIG. 12 illustrates such an array of the photosensitive devices shown schematically as devices 80*a–n*. The devices are formed on a common substrate by either of the processes shown in FIGS. 1–6. The collectors of each of the devices 80*a–n* are commonly connected to circuit ground. The individual emitter contacts, which comprise the metal contacts centrally disposed adjacent the buried P-type base regions, serve as the individual output terminals for each unit. For use as NPN devices, the emitters of the devices 80*a–n* must be biased negative with respect to the common collector terminal.

Current mode amplifiers are provided for each channel in order to meet the requirement for short circuit operation on the output of the devices. The emitter of each of the devices is thus connected to an input of a respective current mode amplifier 82*a–n*. A variable resistance 84*a–n* is connected between the emitter of the devices and a source of negative supply voltage. The resistors 84*a–n* may be adjusted when required to compensate for variations in the value of the sheet resistances of each of the various devices. Resistances 86*a–n* are connected between the source of negative voltage supply and the second input of the amplifiers 82*a–n*. Resistances 88*a–n* are connected between the second input of the amplifiers and circuit ground. The magnitudes of the resistors 86*a–n* and 88*a–n* determine the negative bias voltage applied to each of the photosensitive devices 80*a–n*.

If desired, only a pair of fixed resistances 86 and 88 may be fabricated and shared by each of the amplifiers 82*a–n*. Resistances 90*a–n* are connected across the various amplifiers 82*a–n* and are adjustable to compensate for variations in $\beta$ between various devices. Coupling capacitors 92*a–n* are provided at each of the amplifier outputs. Amplifiers 82*a–b* may comprise any one of a plurality of linear integrated circuit amplifiers with a differential input stage and ± 1 volt of common mode rejection. Resistances 90*a–n* will generally be of the order of 5*k* ohms or less. If desired, the coupling capacitor and the resistors shown in FIG. 12 may be external to the integrated circuit bar.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A semiconductor phototransistor comprising:

a. a semiconductor body of one conductivity type providing a collector region of said phototransistor and having first and second plane surfaces on opposites sides thereof;

b. a layer of insulating material substantially transparent to incident optical radiation covering said first surface;

c. a thin island region of opposite conductivity type wholly disposed within said semiconductor body in closely spaced relation with said first surface and spaced a greater distance from said second surface, said thin island region defining a buried base region completely surrounded by semiconductor material of said one conductivity type;

d. said semiconductor material of said one conductivity type including a thin layer overlying said island region, said thin layer having a predetermined thickness and a predetermined dopant concentration to produce a selected sheet resistance of said thin layer, e. first electrode means disposed on said insulating layer and making ohmic contact with a small area of said thin layer through an aperture in said insulating layer;

f. second electrode means on and ohmically connected with said second surface, and g. said island region having an area directly beneath said first electrode means that together with a contiguous area of said thin layer defines a base-emitter junction of said phototransistor, and the junction between the remainder of said island region and contiguous semiconductor material of said one conductivity type defining a photodetecting base-collector junction of said phototransistor.

2. A semiconductor phototransistor comprising:

a. a semiconductor body of one conductivity type providing a collector region for said phototransistor and having first and second plane surfaces on opposite sides thereof, b. a layer of insulating material substantially transparent to incident optical radiation convering said first surface;

c. a thin island region of opposite conductivity type wholly disposed within said semiconductor body in closely spaced relation with said first surface and spaced a greater distance from said second surface, said thin island region defining a buried base region completely surrounded by semiconductor material of said one conductivity type;

d. a small area region of said opposite conductivity type extending from said first surface into said thin island region to define an emitter-base junction of said phototransistor;

e. said semiconductor material of said one conductivity type including a thin layer overlying said island region and surrounding said small area region of said opposite conductivity type, said thin layer defining part of said first plane surface and having a predetermined thickness and predetermined dopant concentration producing a selected sheet resistance of said thin layer;

f. first electrode means disposed on said insulating layer and making ohmic contact with said small area region through an aperture in said insulating layer;

g. second electrode means on and ohmically connected with said second surface, and h. said island region and contiguous semiconductor material of said one conductivity type other than that of said small area region defining a photodetecting base-collector region junction of said phototransistor.

3. A semiconductor phototransistor comprising:

a. a semiconductor body of one conductivity type providing a collector region of said phototransistor and having first and second plane surfaces on opposite sides thereof;

b. a layer of insulating material substantially transparent to incident optical radiation on said first surface, said layer of insulating material having an aperture therein;

c. a thin island region of one conductivity type wholly located within said semiconductor body in closely spaced relation with the parallel to said first surface and spaced a greater distance from said second surface, said thin island region defining a buried base region completely surrounded by semiconductor material of said one conductivity type;

d. said semiconductor material of said one conductivity type including a thin layer overlying said island region and providing part of said first plane surface, said thin layer having a predetermined thickness and a predetermined dopant concentration to produce a selected sheet resistance of said thin layer, e. first electrode means disposed on said insulating layer and making ohmic contact with a small area of said thin layer through said aperture therein, f. second electrode means on and ohmically connected with said second plane surface, and g. the junction between an area of said thin island region immediately beneath said first electrode means and a contiguous area of said thin layer defining a base-emitter junction of said phototransistor, and the junction between the remainder of said thin island region and contiguous semiconductor material of said one conductivity type defining a photodetecting base-collector junction of said phototransistor;

h. said selected sheet resistance of said thin layer being such that responsive to a selective bias voltage across said first and second electrode means, current flow adjacent said first electrode means occurs radially through said thin layer causing a significant voltage drop in said thin layer adjacent said first electrode means to cause (i) forward biasing of said baseemitter junction and (ii) reverse biasing of the said base-collector junction emitter junction and (ii) reverse biasing of the said base-collector junction of said phototransistor.

4. The semiconductor phototransistor of claim 1 wherein said electrode means is disposed directly above the central region of said island region and contacts a small area of said thin layer.

5. The semiconductor phototransistor of claim 4, wherein said one conductivity type is N-type and said opposite conductivity type is P-type.

6. The semiconductor phototransistor of claim 5 wherein said second electrode means includes an *N*+ layer on said second surface of said semiconductor body.

7. The semiconductor phototransistor of claim 2 wherein said second electrode means comprises a more highly doped layer of said one conductivity type disposed upon said second surface of said semiconductor body.

8. The semiconductor phototransistor of claim 2 wherein said first electrode means is centered over said island region.

9. The semiconductor phototransistor of claim 8, wherein said one conductivity type is N-type and said opposite conductivity type is P-type.

* * * * *